(12) United States Patent
Sun et al.

(10) Patent No.: US 8,446,752 B2
(45) Date of Patent: May 21, 2013

(54) PROGRAMMABLE METALLIZATION CELL SWITCH AND MEMORY UNITS CONTAINING THE SAME

(75) Inventors: Ming Sun, Eden Prairie, MN (US); Nurul Amin, Woodbury, MN (US); Insik Jin, Eagan, MN (US); Young Pil Kim, Eden Prairie, MN (US); Chulmin Jung, Eden Prairie, MN (US); Venugopalan Vaithyanathan, Bloomington, MN (US); Wei Tian, Bloomington, MN (US); Hai Li, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 812 days.

(21) Appl. No.: 12/497,767

(22) Filed: Jul. 6, 2009

(65) Prior Publication Data

US 2010/0110764 A1    May 6, 2010

Related U.S. Application Data

(60) Provisional application No. 61/109,574, filed on Oct. 30, 2008.

(51) Int. Cl.
*G11C 11/00* (2006.01)

(52) U.S. Cl.
USPC ............. 365/148; 365/163; 257/2; 257/4; 257/E45.002

(58) Field of Classification Search
USPC ............ 365/148, 163; 257/2, 4, E45.002
See application file for complete search history.

(56) References Cited

U.S. PATENT DOCUMENTS

| | | | | |
|---|---|---|---|---|
| 7,257,014 | B2 * | 8/2007 | Symanczyk | 365/148 |
| 7,515,454 | B2 * | 4/2009 | Symanczyk | 365/148 |
| 2006/0082526 | A1 * | 4/2006 | Anthony et al. | 345/82 |
| 2006/0126413 | A1 | 6/2006 | Liaw | |
| 2008/0112207 | A1 | 5/2008 | Pinnow | |
| 2008/0273370 | A1 * | 11/2008 | Keller et al. | 365/148 |

* cited by examiner

*Primary Examiner* — Toan Le
(74) *Attorney, Agent, or Firm* — Mueting Raasch & Gebhardt PA

(57) ABSTRACT

An electronic device that includes a first programmable metallization cell (PMC) that includes an active electrode; an inert electrode; and a solid electrolyte layer disposed between the active electrode and the inert electrode; and a second PMC that includes an active electrode; an inert electrode; and a solid electrolyte layer disposed between the active electrode and the inert electrode, wherein the first and second PMCs are electrically connected in anti-parallel.

19 Claims, 13 Drawing Sheets

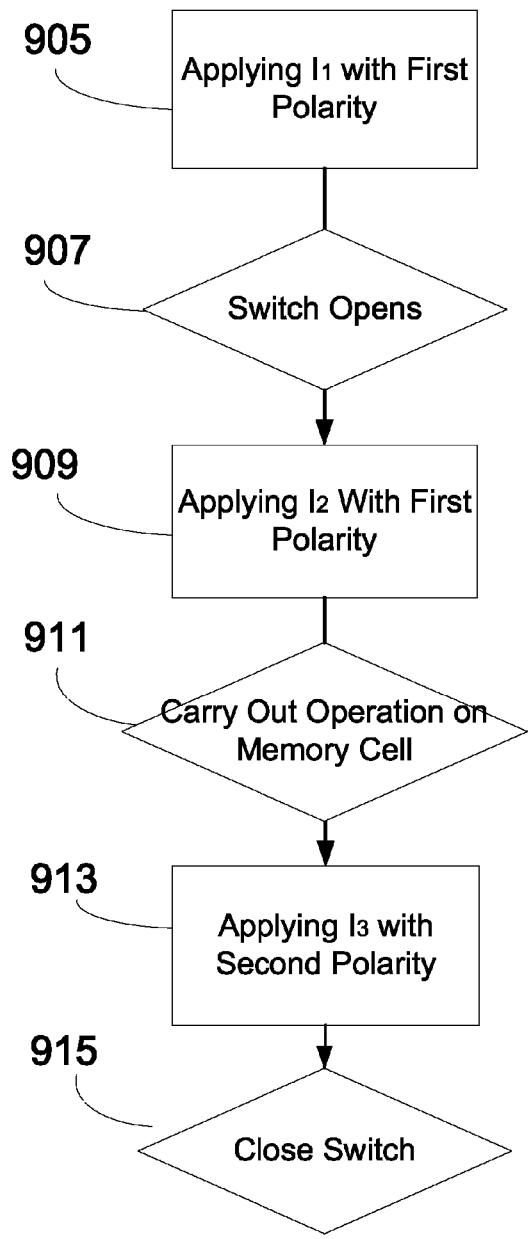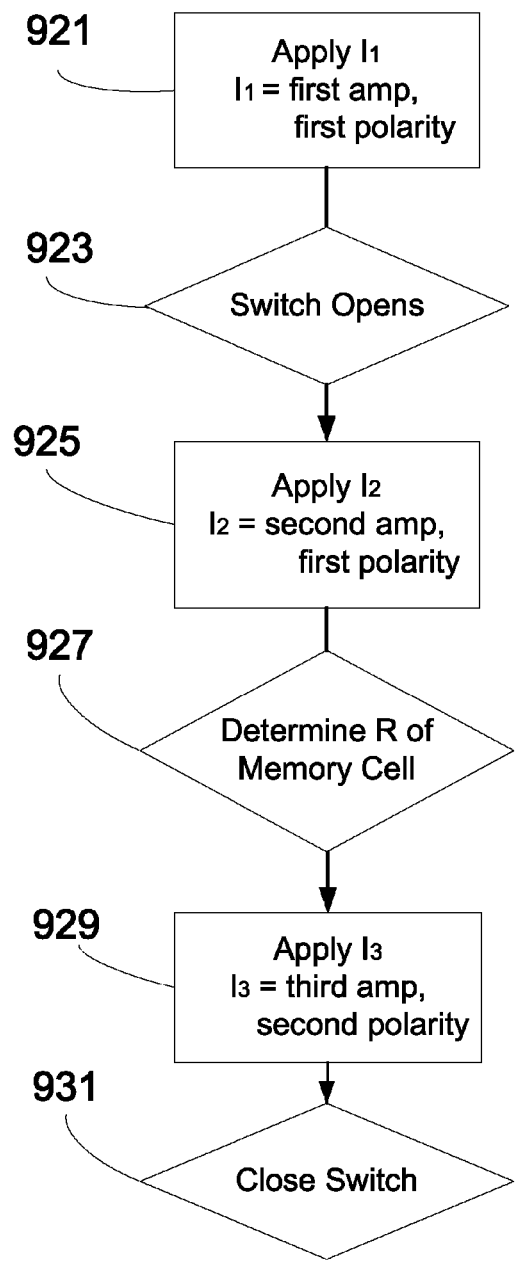
FIG. 9A
FIG. 9B

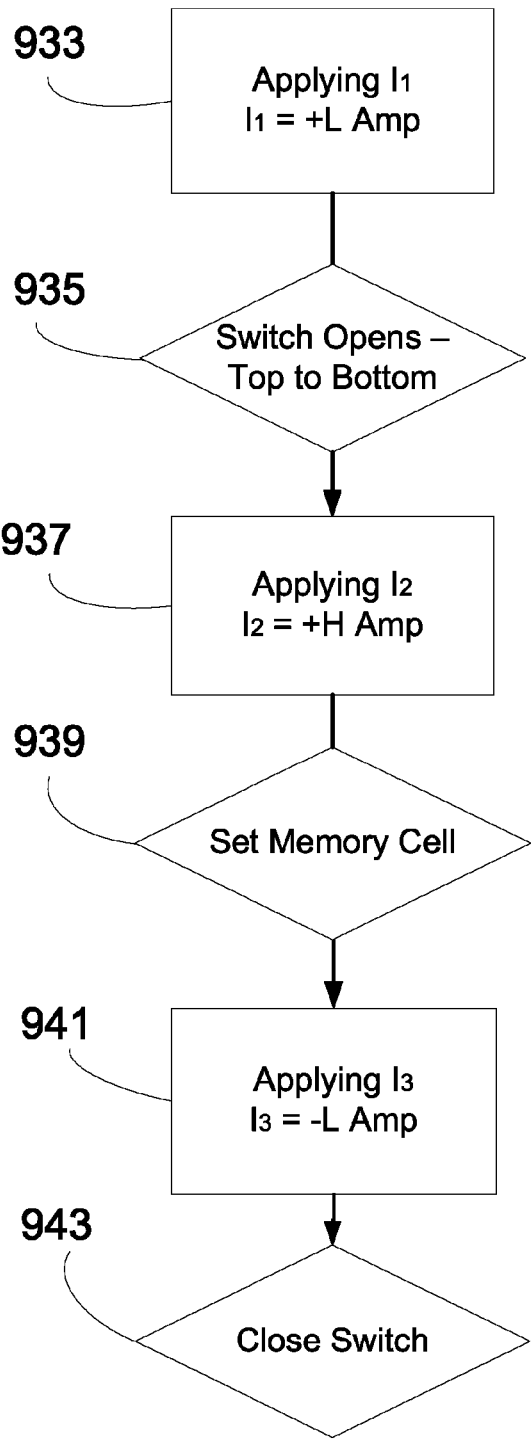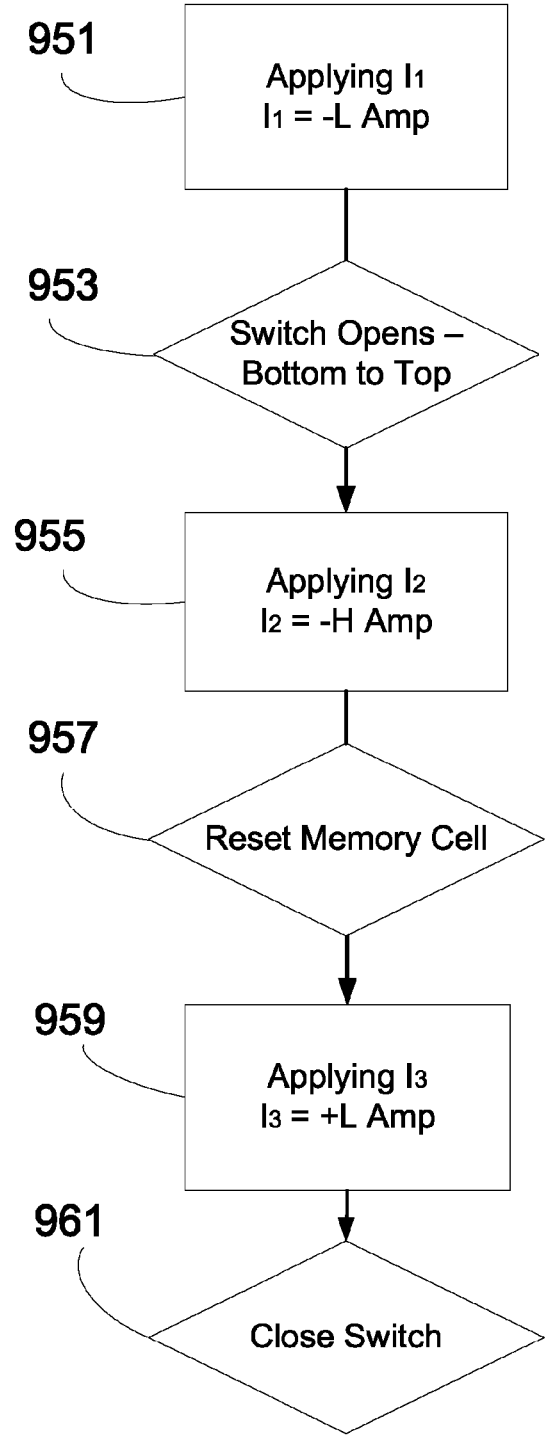
FIG. 9C
FIG. 9D

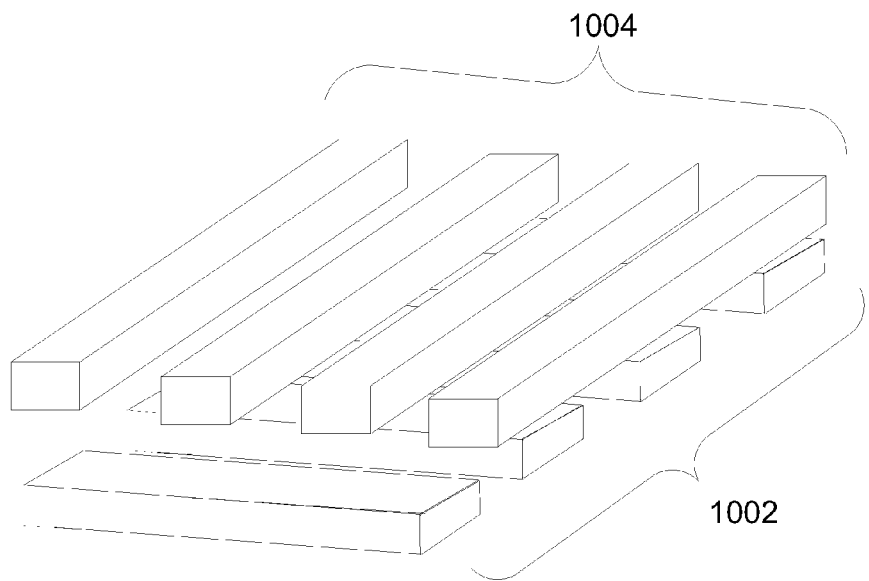
FIG. 10A
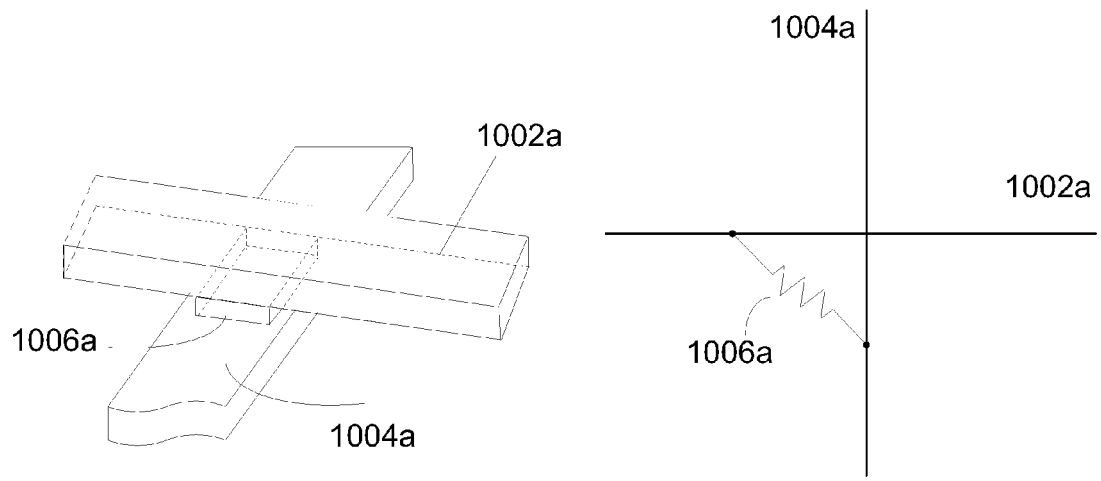
FIG. 10B
FIG. 10C

PROGRAMMABLE METALLIZATION CELL SWITCH AND MEMORY UNITS CONTAINING THE SAME

PRIORITY

This application claims priority to U.S. Provisional Application No. 61/109,574 entitled "PMC SWITCH FABRICATION METHOD AND ITS APPLICATION AS SELECTIVE ELEMENT FOR HIGH DENSITY CROSS BAR ARRAYS" filed on Oct. 30, 2008, the disclosure of which is incorporated herein by reference.

BACKGROUND

New types of memory have demonstrated significant potential to compete with commonly utilized types of memory. For example, non-volatile spin-transfer torque random access memory (referred to herein as "STRAM") and resistive random access memory (referred to herein as "RRAM") are both considered good candidates for the next generation of memory. The ability of STRAM and RRAM to more effectively compete with established memory types, such as FLASH memory (NAND or NOR) can be maximized by increasing the density at which memory units (a memory cell and its associated driving device) can be formed on a chip.

BRIEF SUMMARY

Disclosed herein is an electronic device that includes a first programmable metallization cell (PMC) that includes an active electrode; an inert electrode; and a solid electrolyte layer disposed between the active electrode and the inert electrode; and a second PMC that includes an active electrode; an inert electrode; and a solid electrolyte layer disposed between the active electrode and the inert electrode, wherein the first and second PMCs are electrically connected in anti-parallel.

Disclosed herein is a non volatile memory element that includes a switching device that includes a first programmable metallization cell (PMC) having an active electrode; an inert electrode; and a solid electrolyte layer disposed between the active electrode and the inert electrode; and a second PMC that includes an active electrode; an inert electrode; and a solid electrolyte layer disposed between the active electrode and the inert electrode, wherein the first and second PMCs are electrically connected in anti-parallel; and a non volatile memory cell, wherein the switching device is electrically connected in series with the non volatile memory cell.

Also disclosed are methods of utilizing a non volatile memory element that includes the steps of: providing a non volatile memory element, the non volatile memory element having a switching element that includes a first and second programmable metallization cell (PMC) configured in anti-parallel; and a non volatile memory cell having at least a high resistance state and a low resistance state, wherein the switching element is electrically connected in series with the non volatile memory cell; applying a first current to the non volatile memory element, the first current having a first polarity and a first amplitude, wherein application of the first current opens the switching element; applying a second current to the non volatile memory element, the second current having a second polarity and a second amplitude, wherein application of the second current reads from or writes to the non volatile memory cell; and applying a third current to the non volatile memory element, the third current having a third polarity and a third amplitude, wherein application of the third current closes the switching element, wherein the first current and the second currents have the same polarity and the third current has a polarity that is opposite from the first current and the second current.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIGS. 6A through 6L depict various stages of an exemplary method of fabricating an electronic device as disclosed herein;

FIG. 7C depict RRAM) that can be utilized in non volatile memory elements disclosed herein;

FIGS. 9A through 9D are flowcharts depicting exemplary methods disclosed herein;

FIGS. 10A through 10C are perspective views (FIGS. 10A and 10B) and a diagrammatic view (FIG. 10C) of portions of crossbar memory arrays that can incorporate non volatile memory units as disclosed herein;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
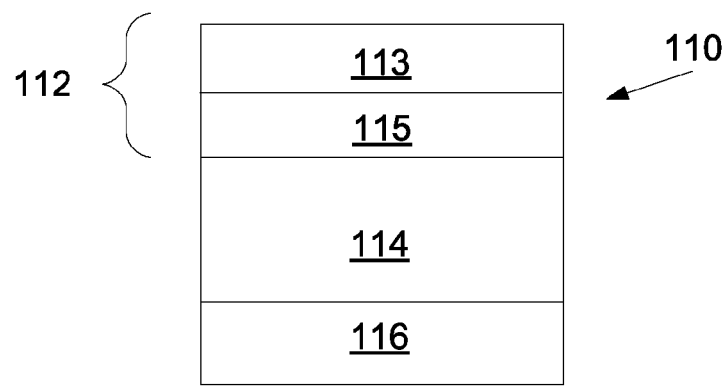
FIG. 1 is a schematic diagram of a programmable metallization cell (PMC)

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Disclosed herein are electronic devices that can be utilized as switches. The disclosed electronic devices can also be referred to as switching devices. Generally, a switch is an electrical component that can break an electrical circuit, interrupting the current or diverting it from one conductor to another. Switching devices as disclosed herein can be utilized in applications where a large on/off ratio (large forward current and extremely small reverse current) is desirable. The switching devices can be utilized in applications which previously utilized or would have utilized a diode, as well as other applications. Devices disclosed herein can have switching speeds in the range of nanoseconds to microseconds with low current (about 50 μA) or low voltage (500 mV), therefore they may also be advantageously utilized in high frequency applications (over 1 MHz), low voltage operation applications, or both; an exemplary application includes basic logic circuit switchers. An electronic device disclosed herein can include two programmable metallization cells (PMCs).

A schematic diagram of an embodiment of a PMC is shown in FIG. 1. The PMC 110 depicted in FIG. 1 includes an active electrode 112, a solid electrolyte layer 114 and an inert electrode 116. The solid electrolyte layer 114 is positioned between the active electrode 112 and the inert electrode 116.

The active electrode 112 includes a metal that dissolves in the solid electrolyte layer when a sufficient bias is applied across the electrodes (i.e. the active electrode is an oxidizable electrode) and the inert electrode 116 is relatively inert and does not dissolve during operation of the PMC. When a negative bias is applied to the inert electrode 116, metal ions in the solid electrolyte 114 as well as some originating from the now-positive active electrode 112, flow in the solid electrolyte 114 and are reduced (converted to metal atoms) by electrons from the inert electrode 116. After a short period of time the ions flowing into the solid electrolyte layer form a small metallic nanowire or nanofilament between the two electrodes. The nanowire dramatically reduces the resistance along that path leaving the PMC with a low resistance state. When an electric field of the opposite polarity is applied across the electrodes, the nanowire(s) dissolve and the conducing paths are disrupted, leaving the PMC with a high resistance state.

The inert electrode 116 can generally be a conductive material. The inert electrode can generally include metals, metal alloys, a think oxide material, a multi-component mixture of materials, or a laminated structure. Exemplary conductive materials include tungsten (W) and molybdenum (Mo), noble metals including platinum (Pt), and iridium (Ir), transition metals, including titanium (Ti), metal silicides, and metal nitrides, including tungsten nitride, titanium nitride, and the like. In embodiments, the inert electrode 116 can have a thickness from about 50 Å to about 5000 Å.

The active electrode 112 can generally include a metal that dissolves in the solid electrolyte layer, such as silver (Ag), copper (Cu), tantalum (Ta), or titanium (Ti), for example. The active electrode can generally include metals, metal alloys, a think oxide material, a multi-component mixture of materials, or a laminated structure. In embodiments, such as that depicted in FIG. 1, the active electrode 112 can be composed of two separate layers, an electrode layer 113 and the layer of dissolvable material, which can also be referred to as a doping layer 115. In embodiments, the doping layer 115 can be positioned directly adjacent the electrode layer 113 of the active electrode 112, without intervening layers. The doping layer 115 can include materials that can dissolve in the solid electrolyte layer, such as Ag, Cu, Ta, Ti, for example. The doping layer 115 often has a thickness of about 2-50 nm. The electrode layer 113 of the active electrode 112 can be a conductive material, such as a metal. The electrode layer 113 can be made of any conductive material, including but not limited to, tungsten (W) or a noble metal such as gold (Au), platinum (Pt), palladium (Pd) or rhodium (Rh). In embodiments, the electrode layer 113 can have a thickness from about 50 Å to about 5000 Å. In embodiments, the active electrode 112 can be made "active" in ways other than inclusion of a metal layer within the PMC.

The solid electrolyte layer 114 can be any material that allows for the movement of ions within it from electrode to electrode. Exemplary materials include, but are not limited to, chalcogenide solid electrolyte materials or oxide materials with large ion conductivity or an organic/polymer material. Examples of solid chalcogenide materials include germanium-selenide ($Ge_xSe_{1-x}$) materials, or $Ge_2Sb_2Te_5$ (GST) materials. An example of an oxide material is a $WO_3$ or $SiO_2$. An example of an organic material is poly(3,4-ethylenedioxythiophene) (i.e., PEDOT).

An electronic device as disclosed herein generally includes two PMCs that are configured in anti-parallel. By "anti-parallel configuration" it is meant that the two PMCs are electrically connected so that the same voltage is applied to each PMC (i.e., the PMCs are connected in parallel), but the configurations of the PMCs are opposite. A PMC has a structure that is either (from top to bottom) active electrode/solid electrolyte layer/inert electrode or inert electrode/solid electrolyte layer/active electrode. The active electrode/solid electrolyte layer/inert electrode configuration is considered to be opposite to the inert electrode/solid electrolyte layer/active electrode configuration (and vice versa). Therefore, in a device as disclosed herein, a PMC having an active electrode/solid electrolyte layer/inert electrode configuration is electrically connected in parallel to a PMC having an inert electrode/solid electrolyte layer/active electrode configuration (or vice versa) so that the same voltage is applied to each PMC.

Figure 2:
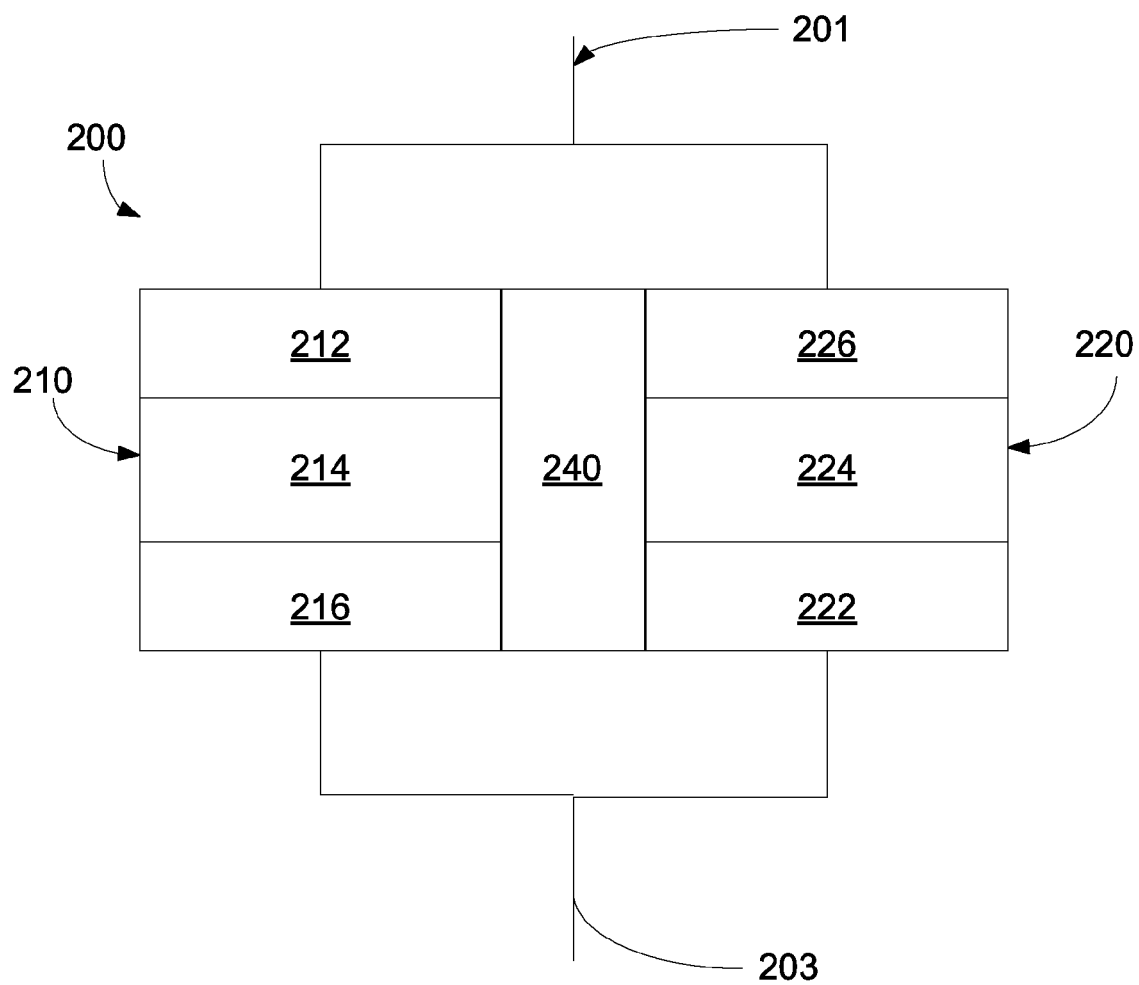
FIG. 2 is a schematic diagram of a disclosed electronic device that includes first and second PMCs.

FIG. 2 depicts a schematic diagram of an electronic device as disclosed herein. The electronic device 200 includes a first PMC 210 and a second PMC 220 that are electrically connected so that the same voltage is applied to each PMC, i.e. they are connected in parallel. For the purposes of clarity, the PMC on the left side of an electronic device (as the viewer is looking at the electronic device) will be referred to as the first PMC (PMC 210 in FIG. 2); and the PMC on the right side of an electronic device will be referred to as the second PMC (PMC 220 in FIG. 2). Also for purposes of clarity, the electrical connection at the top of the electronic device will define the top 201 of the electronic device and the electrical connection at the bottom will define the bottom 203 of the electronic device. As can be seen in FIG. 2, the first PMC 210 includes (from top to bottom) the active electrode 212, the solid electrolyte layer 214 and the inert electrode 216, while the second PMC 220 includes (from top to bottom) the inert electrode 226, the solid electrolyte layer 224 and the active electrode 222. Therefore, the first PMC 210 and the second PMC 220 are anti-parallel (electrically connected so that the same voltage is applied to each PMC, but have opposite configurations).

The electronic device depicted in FIG. 2 is an example of a unitary device. Although not depicted herein, it is envisioned that two PMCs (for example first PMC 210 and second PMC 220) can be fabricated separately, can be multi-part and be electrically connected in anti-parallel to form a disclosed electronic device. The electronic device 200 depicted in FIG. 2 includes an insulator region 240 that allows a single monolithic article to form two separate PMCs. The insulator region 240 functions to electrically insulate the first PMC 210 from the second PMC 220. The insulator region 240 can be made of any electrically insulating material. Exemplary materials include, but are not limited to, dielectric materials such as alumina ($Al_2O_3$), silicon dioxide ($SiO_2$), and silicon nitride (SiN).

Figure 3:
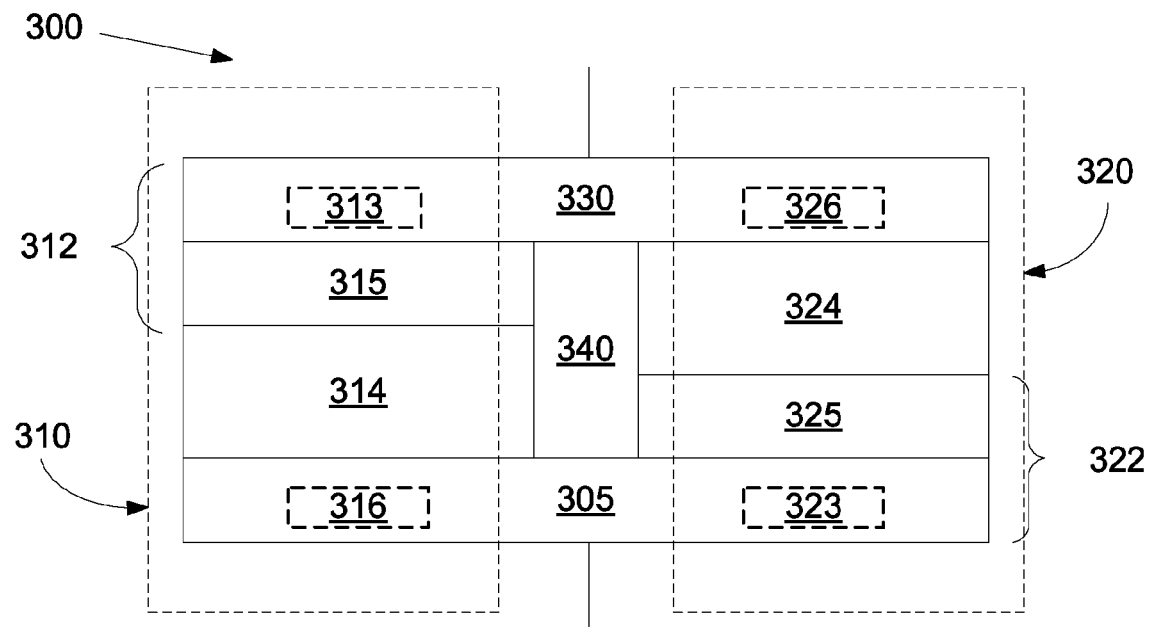
FIG. 3 is a schematic diagram of a disclosed electronic device that includes first and second PMCs.

FIG. 3 depicts an embodiment of an electronic device 300 as disclosed herein. The electronic device generally includes a first PMC 310 and a second PMC 320. Although the electronic device has shared components, functionally, the electronic device includes two separate PMCs. The electronic device includes a top electrode 330 and a bottom electrode 305. The top electrode 330 functions as the electrode layer 313 of the active electrode 312 in the first PMC 310 and the inert electrode 326 in the second PMC 320. The bottom electrode 305 functions as the electrode layer 323 of the active electrode 322 in the second PMC 320 and the inert electrode 316 in the first PMC 310. The first PMC 310 therefore includes a shared structure that acts as the inert electrode 316, a solid electrolyte layer 314, and an active electrode 312 that includes a doping layer 315 and a shared structure that acts as the electrode layer 313. The second PMC 320 therefore includes a shared structure that acts as the inert electrode 326, a solid electrolyte layer 324, and an active electrode 322 that includes a doping layer 325 and a shared structure that acts as the electrode layer 323. As seen in FIG. 3, the first PMC 310 and second PMC 320 are electrically isolated (except for the shared components, the top electrode 330 and the bottom electrode 305) by an insulator 340.

The top electrode 330 and the bottom electrode 305 can generally be made of the same materials as the inert electrode and electrode layer discussed with respect to FIGS. 1 and 2. In embodiments, the top electrode 330 and the bottom electrode 305 are made of the same material, and in embodiments they are made of different materials. In embodiments, the top electrode 330 and the bottom electrode 305 can independently be made of tungsten (W), molybdenum (Mo), platinum (Pt), iridium (Ir), titanium (Ti), gold (Au), palladium (Pd), rhodium (Rh), metal silicides, and metal nitrides, including tungsten nitride, titanium nitride for example. In embodiments, the top electrode 330 and the bottom electrode 305 can be independently made of W, Pt, Pd, or Rh. In embodiments, the top electrode 330 and the bottom electrode 305 can independently have thicknesses from about 20 nm to about 5000 nm.

Figure 4:
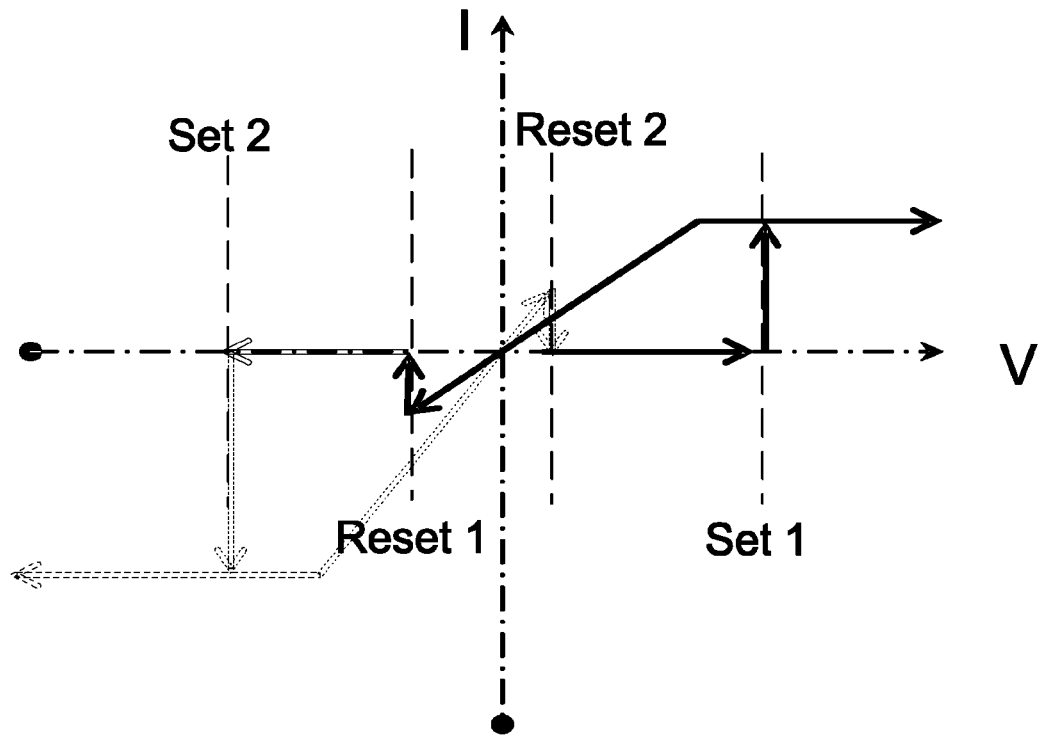
FIG. 4 is a representative current-voltage (I-V) curve of an electronic device disclosed herein.

Electronic devices as disclosed herein can function as switches, or selective elements. FIG. 4 illustrates a current voltage curve (I-V curve) of an electronic device as disclosed herein. The particular I-V curve is an illustration of the response of a device similar to that depicted in FIG. 3 (a device with the first PMC having an active electrode on top and the second PMC having an active electrode on the bottom). The I-V curve shows reset and set voltages. A reset voltage in the context of electronic devices as disclosed herein is the voltage at which the particular PMC (either the first or second PMC) will revert to the high resistance state, i.e. the metal atoms making up the nanowires will be oxidized and the high resistance path across the PMC will be severed. A set voltage in the context of electronic devices as disclosed herein is the voltage at which the particular PMC (either the first or second PMC) will revert to the low resistance state, i.e. the metal ions in the solid electrolyte will be reduced and form nanowires across the PMC to form the low resistance path.

The bold line in the I-V curve of FIG. 4 is for the first PMC 310 and the dashed line is for the second PMC 320. The reset voltage for the first PMC 310 is "Reset 1" and the set voltage for the first PMC 310 is "Set 1"; and the reset voltage for the second PMC 320 is "Reset 2" and the set voltage for the second PMC 320 is "Set 2". As seen in FIG. 4, the voltages and currents of set 1 and set 2 have opposite polarities; set 1 is a positive voltage with a positive current and set 2 is a negative voltage with a negative current. Electronic devices that include oppositely configured first and second PMCs (first PMC has active electrode on bottom and second PMC has active electrode on top) would still have opposite polarities for set 1 and set 2, but they would be opposite; set 1 would be negative and set 2 would be positive. FIG. 4 also shows that the currents at the set voltages (Set 1 and Set 2) have greater amplitudes than the currents at the reset voltages (Reset 1 and Reset 2). In embodiments, PMCs that produce set voltages that are higher than the reset voltages can be utilized in electronic devices as disclosed herein. This difference can be dictated, at least in part, by the materials making up the first and second PMCs. The I-V curve also shows that the current at set 1 is positive and the current at set 2 is negative.

The behavior of disclosed electronic devices that is shown by FIG. 4 can be utilized in order to use the electronic devices as a switch. If a current of a first polarity is applied across the electronic device in a first direction, the electronic device will function as an open switch in that direction and at least a substantially closed switch in the opposite direction. If a current of the opposite polarity is applied across the electronic device in a first direction, the electronic device will function as at least a substantially closed switch in that direction and an open switch in the opposite direction. The switching device could be characterized as substantially closed in one direction because as seen in FIG. 4 even at the reset voltage some current is still allowed to flow through the device.

Figure 5A:
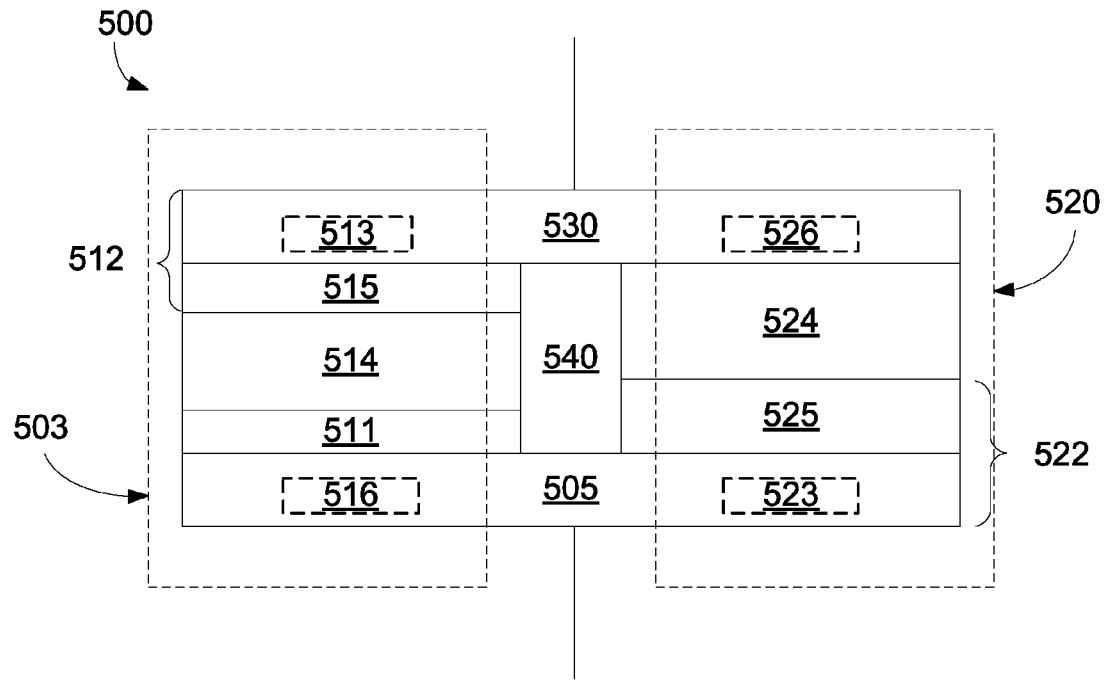
FIGS. 5A and 5B are schematic diagrams of disclosed electronic devices that include over potential layers within one (FIG. 5A) or both (FIG. 5B) PMCs.
Figure 5B:
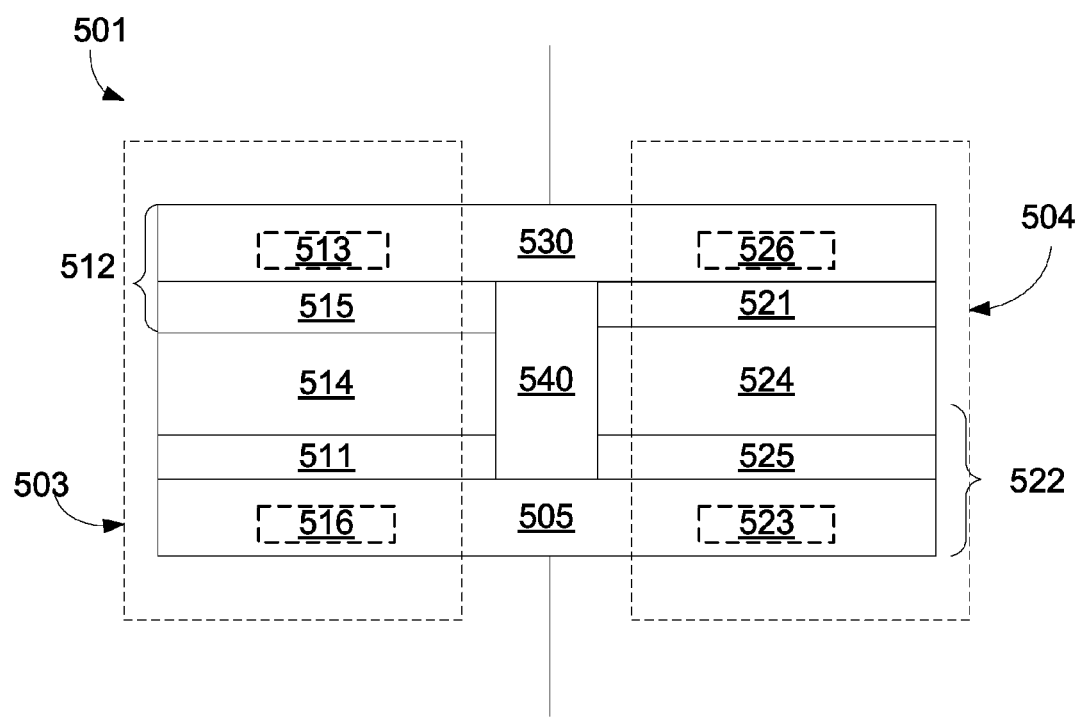

Another embodiment of an electronic device is depicted in FIG. 5A. The device in FIG. 5A includes the above discussed components generally configured as discussed above but can also include an over potential layer 511. The over potential layer 511 can be positioned adjacent to, or in embodiments directly adjacent to an inert electrode, such as the inert electrode 516 of the first PMC 503. Although not depicted herein, it should also be noted that an over potential layer could be positioned adjacent to, or in an embodiment, directly adjacent to the inert electrode 526 of the second PMC 520. The embodiment depicted in FIG. 5B depicts an electronic device 501 that includes two over potential layers 511 and 521 positioned adjacent to, or in an embodiment, directly adjacent to the inert electrodes 516 and 526 of the first PMC 503 and the second PMC 504 respectively.

The over potential layer or layers functions to increase the reduction potential of metal ions on top of the inert electrode, thereby increasing the amplitude (either positively or negatively) of the set voltage. This can be advantageous because it can create more distance between the reset voltage for one side of the electronic device and the set voltage for the opposite side of the electronic device. The over potential layer can also be utilized to specifically tune the set or reset potentials for various applications. When the electronic device is used as a switch this can be advantageous because it more effectively delineates the voltages to effect "on" and "off" from the voltages that only effect a reset of the two sides, which will cause a slight current increase. The more that the set voltage is removed from the reset voltage, the easier it is to be able to apply a single voltage that will have a single effect (either "on" or "off"). The device couple also apply complied current in order to limit the maximum current through the device, this can be seen from the flat region in the I-V curves.

The over potential layer can be made of a material that modifies the inert electrode surface conditions, effects the charge transfer and metal ion diffusion in the solid electrolyte, or a combination thereof. Stated another way, the material of the over potential layer can be said to effect the metal filament crystallization potentials. The over potential layer can be made of a material that has a resistivity higher than that of the solid electrolyte layer 514 or 524. Exemplary materials include insulator or semiconductor materials. Specifically, materials such as silicon oxides, silicon nitrides, rare-earth oxide films, rare-earth nitride films, amorphous silicon, amorphous germanium or amorphous chalcogenides may be utilized.

An exemplary fabrication scheme for an electronic device, such as that depicted in FIG. 2 is provided in FIGS. 6A through 6L. Generally, such fabrication schemes can include semiconductor fabrication methods including photolithography techniques. Deposition methods, including but not limited to, plasma vapor deposition (PVD), ionized plasma based sputtering, long throw sputtering, chemical vapor deposition (CVD), atomic layer deposition (ALD), and metal organic chemical vapor deposition (MOCVD) can be utilized to deposit the various layers deposited in the exemplary method. The steps depicted in FIGS. 6A to 6L in no way limit the way in which an electronic device as disclosed herein can be fabricated. It should also be noted that the figures are not necessarily to scale and do not necessarily depict the article at every state of preparation, i.e. some intermediate stages of the article may not be illustrated in the sequence of figures. The materials and processes discussed with respect to FIGS. 6A to 6L also in no way limit materials or processes that can be utilized herein.

The exemplary method illustrated in FIGS. 6A through 6L does not depict the use of a substrate. One of skill in the art, having read this specification, will understand that use of a substrate is not necessary, electronic devices as disclosed herein can be fabricated without use of a substrate, the electronic device can be placed on a support after fabrication, a substrate can be utilized and then removed either during or after fabrication of the electronic device, or a substrate does not need to be utilized at all. The substrate, if utilized, can include materials such as silicon, a mixture of silicon and germanium, and other similar materials.

Figure 6A:

The first step in the exemplary method is formation of a bottom contact 601. The bottom contact 601 can function to provide electrical connection to the electronic device. The bottom contact 601 can be formed of any conductive material. Exemplary conductive materials include, but are not limited to, Ag, Cu, Au, Pt, W and TiN. The lower contact 601 can be from about 20 nm to about 500 nm thick. FIG. 6A depicts the electronic device after formation of the bottom contact 601

Figure 6B:
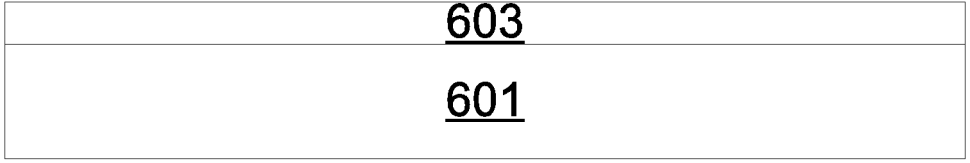

The next step is deposition of the first conductive material layer 603. The first conductive material layer 603, after processing will become the inert electrode of the first PMC. The first conductive material layer 603 can include materials that can be utilized as the inert electrode, including but not limited to conductive material such as W, Mo, Pt, Ir, Ti, Au, Pd, Rh, metal silicides, and metal nitrides. The first conductive material layer 603 can be from about 20 nm to about 500 nm thick. FIG. 6B depicts the electronic device after deposition of the first conductive material layer 603 on the bottom contact 601.

Figure 6C:
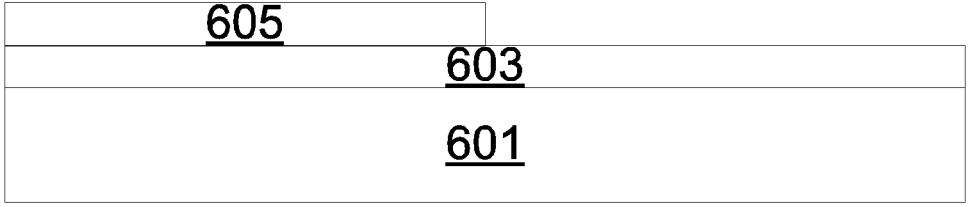

The next step is formation of the first photoresist mask 605. Formation and use of the first photoresist mask 605 can be accomplished using various etching and patterning techniques. Patterning generally describes a process or a series of processes that shape or alter the existing shape of the deposited materials and can be referred to as lithography. For example, in conventional lithography, the layer to be patterned can be coated with a chemical called photoresist. The photoresist can then be exposed by a stepper, a machine that focuses, aligns, and moves a mask, exposing select portions of the layer to light. The unexposed regions can be washed away by a developer solution. After etching or other processing, the remaining photoresist can be removed using various techniques, such as plasma etching. FIG. 6C depicts the article after the next step, deposition and exposure of a photoresist layer to form the first photoresist mask 605. Any commonly utilized type of photoresist material and photoresist processing techniques can be utilized herein. The first photoresist mask 605 is utilized to etch a portion of the first conductive material layer 603.

Figure 6D:
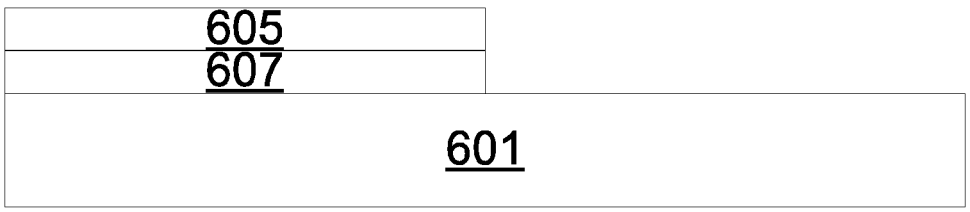

As seen in FIG. 6D, the next step in an exemplary method is to etch the structure, using the first photoresist mask 605 as a protective structure to form the precursor inert electrode 607, by leaving only a portion of the first conductive material 603. The etching can be accomplished by milling, etching, chemical mechanical planarization (CMP) or other such methods.

Figure 6E:
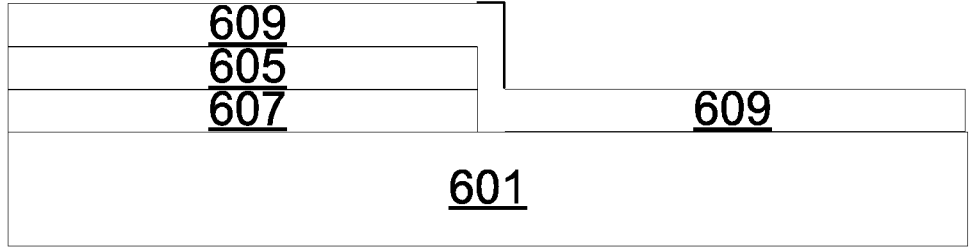

The next step is deposition of the second conductive material layer 609. The second conductive material layer 609, after processing will become the active electrode of the second PMC. The second conductive material layer can include materials that can be utilized as the active electrode, including but not limited to conductive material such as W, Mo, Pt, Ir, Ti, Au, Pd, Rh, metal silicides, and metal nitrides. Alternatively, the conductive material layer 609 can be made of doping materials such as Ag, Ni, Cu. Another alternative includes combining the conductive materials exemplified above with doping materials discussed here as the conductive material layer 609. The second conductive material layer 609 can be from about 20 nm to about 500 nm thick. FIG. 6E depicts the electronic device after deposition of the second conductive material layer 609 on the entire surface of the article.

The next step in an exemplary method is to etch a portion of the structure to form the active electrode of the second PMC. The second conductive material 609 that is positioned over the precursor inert electrode 607 of the first PMC and the first photoresist mask 605 are etched away. The etching can be accomplished by milling, etching, CMP or other such methods. Alternatively, the photo resist mask can be dissolved in an alkaline solution, this can advantageously selectively remove the metal layer on top as well leaving the remaining conductive material 609. The electronic device after this etching step is shown in FIG. 6F and includes the precursor inert electrode 607 of the first PMC and the precursor active electrode 611 of the second PMC.

Although not depicted herein, the precursor active electrode 611 can be formed using a multi step process. A multi step process can be utilized when the active electrode is composed of an electrode layer and a metal layer. In such an embodiment, the material for the electrode layer (possible materials were discussed above) can first be deposited; and then the metal layer can be deposited upon the deposited electrode layer material. The two layers can be deposited as discussed above. The excess of both deposited materials that would exist on the inert electrode of the first PMC could then be etched, in the same fashion that the second conductive material 609 was etched to form the precursor active electrode 611 of the second PMC. Other methods of affecting the precursor active electrode 611 to render it "active" can also be utilized.

The next step is the deposition of the solid electrolyte material. The solid electrolyte material can include materials discussed above, including, but not limited to, chalcogenide solid electrolyte materials or oxide materials with large ion conductivity or an organic/polymer material. Specific examples of solid chalcogenide materials include germanium-selenide ($Ge_xSe_{1-x}$) materials, or $Ge_2Sb_2Te_5$ (GST) materials. A specific example of an oxide material is a $WO_3$ or $SiO_2$. A specific example of an organic material is poly(3,4-ethylenedioxythiophene) (i.e., PEDOT). The solid electrolyte material can be from about 5 nm to about 500 nm thick. FIG. 6G depicts the electronic device after deposition of the solid electrolyte material 613 on the entire surface of the article.

Figures 6F, 6G, 6H, 6I:
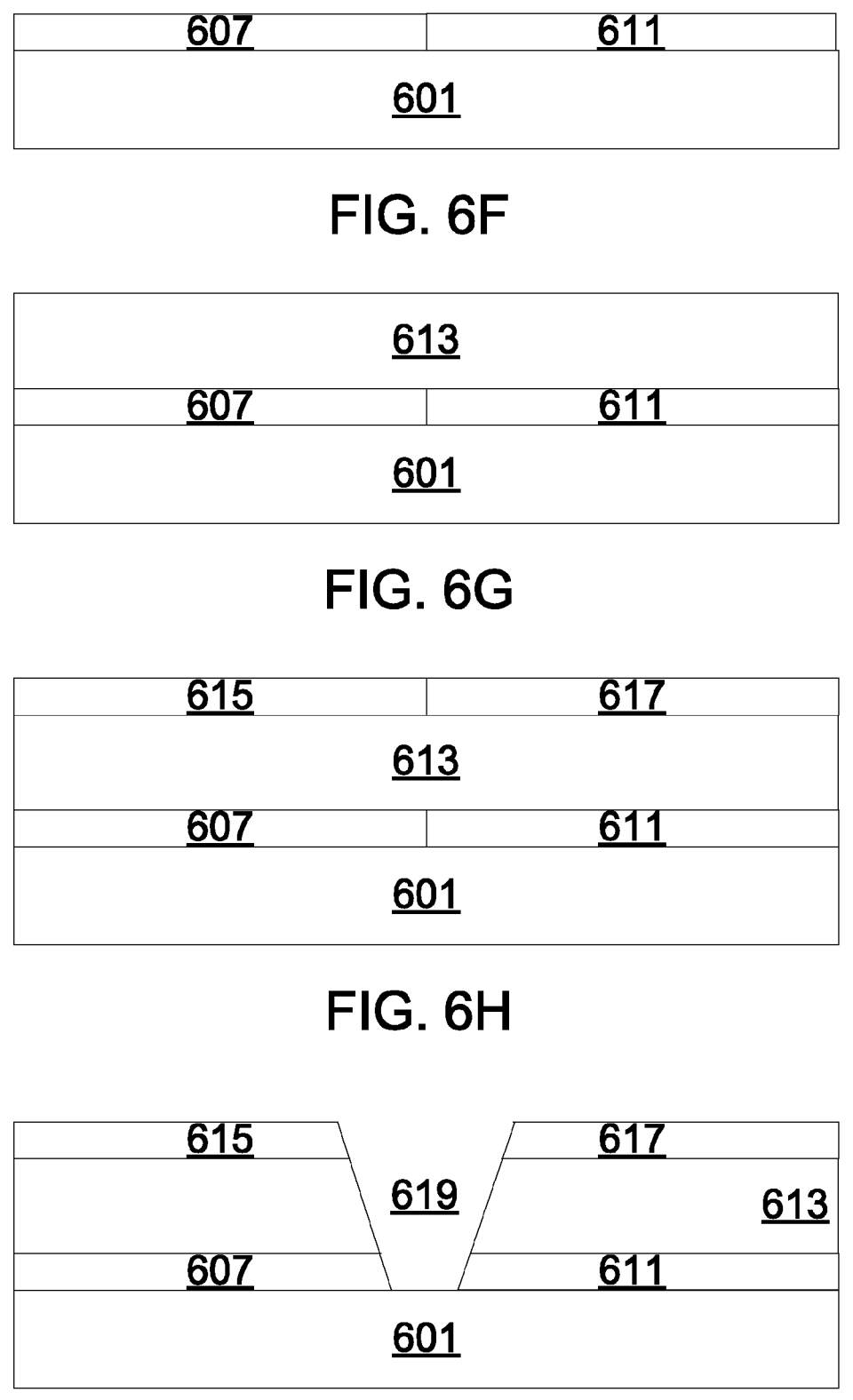

FIG. 6H depicts the electronic device after formation of the precursor active electrode 615 of the first PMC and the precursor inert electrode 617 of the second PMC. These two structures can be formed using process steps and layers similar to those carried out above with respect to FIGS. 6B through 6F and therefore will not be independently discussed herein.

The next step is formation of a via. The via generally functions, to physically and electronically separate the two PMCs. Although not specifically illustrated herein, the via can be formed using etching and patterning techniques as discussed above. The via 619 generally spans the distance of the article at least down to the bottom contact 601. FIG. 6I shows the electronic device after formation of the via 619.

Figure 6J:
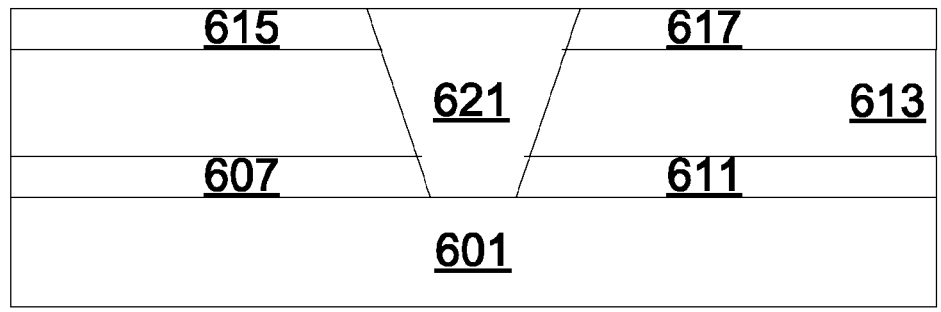

The next step is to fill the via 619 with dielectric material. As discussed above, dielectric materials can include, but are not limited to, $Al_2O_3$, $SiO_2$, and SiN. The dielectric material can be deposited to a thickness that at least fills the via 619. The dielectric material can optionally be filled above the level of the via 619 and CMP, or milled to be level with the via 619. FIG. 6J depicts the electronic device after the via 619 has been filled with dielectric material to form the insulator region 621.

Figure 6K:
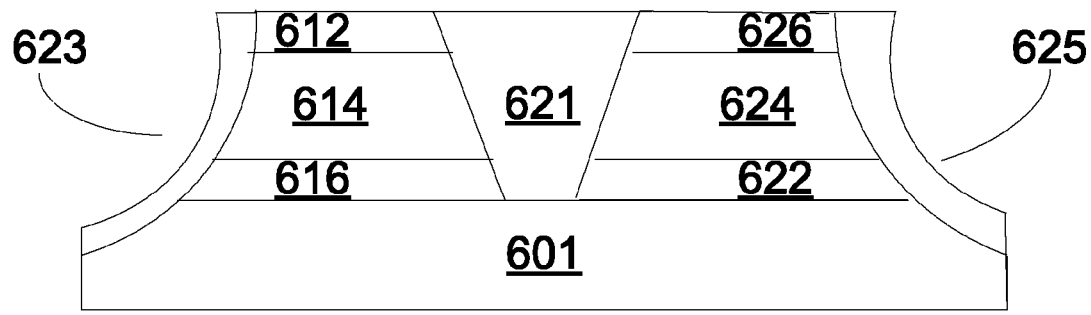

The next step is to complete the electrical isolation of the electronic device. Although not specifically illustrated herein, the electrical isolation can be formed using patterning and etching techniques combined with deposition of a dielectric material and further etching (such as lift off or CMP). FIG. 6K shows the electronic device after completing the electrical isolation of the first PMC with isolator 623 and the second PMC with isolator 625. Once the two PMCs are electrically isolated from each other, the prior layers and formations need no longer be considered precursors. For example therefore, the first PMC now includes an inert electrode 616, a solid electrolyte layer 614 and an active electrode 612. The second PMC now includes an active electrode 622, a solid electrolyte layer 624 and an inert electrode 626. The two PMCs are separated by insulator region 621.

Figure 6L:
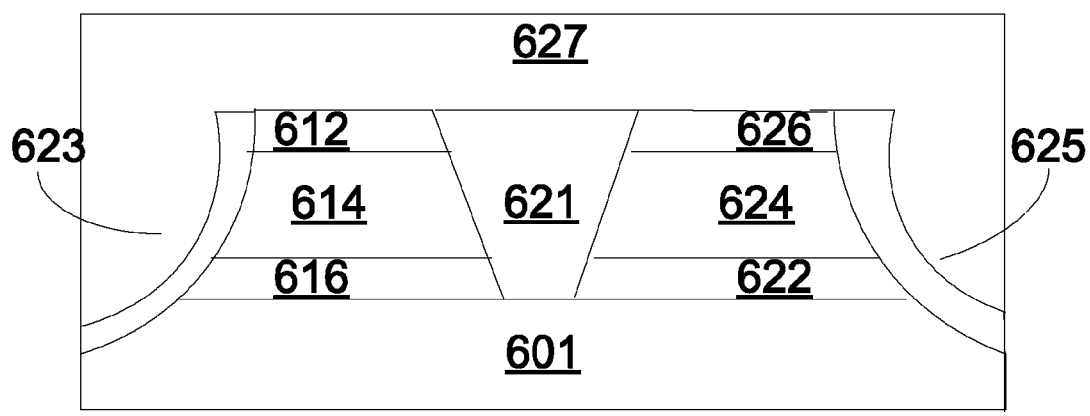

The next step is the deposition of the top contact. The top contact provides electrical connection to the switching device. The top contact can be made of the same material as the bottom contact was, for example Ag, Cu, Au, Pt, W and TiN. The top contact can be from about 50 nm to about 5000 nm thick. FIG. 6L depicts the electronic device after formation of the top contact 627.

Electronic devices as disclosed above can be utilized along with a non volatile memory cell as a selective element for the non volatile memory cell. A non volatile memory cell utilized in a memory device as described herein can include many different types of memory. An exemplary type of non volatile memory cell that can be utilized in electronic devices disclosed herein includes, but is not limited to resistive sense memory (RSM) cells. Exemplary RSM cells include, but are not limited to, ferroelectric RAM (FeRAM or FRAM); magnetoresistive RAM (MRAM); resistive RAM (RRAM); phase change memory (PCM) which is also referred to as PRAM, PCRAM and C-RAM; programmable metallization cell (PMC) which is also referred to as conductive-bridging RAM or CBRAM; and spin torque transfer RAM, which is also referred to as STRAM.

Figure 7A:
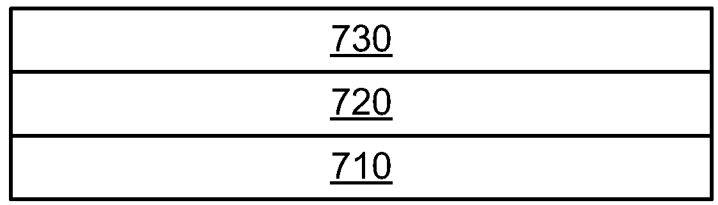
FIGS. 7A through 7C are schematic diagrams of various types of resistive sense memory (RSM) cells (FIGS. 7A and 7B depict STRAM.
Figure 7B:
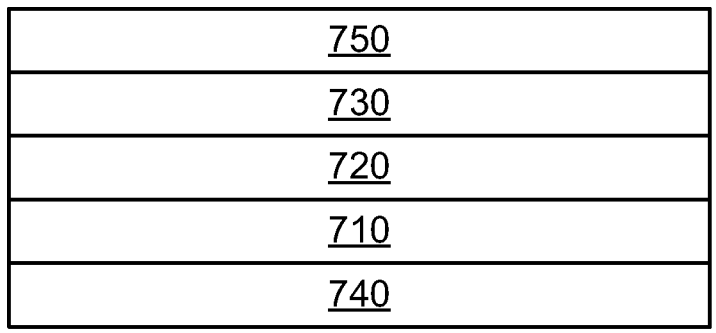

In embodiments, the RSM cell can be a STRAM cell. STRAM memory cells include a MTJ (magnetic tunnel junction), which generally includes two magnetic electrode layers separated by a thin insulating layer, which is also known as a tunnel barrier. An embodiment of a MTJ is depicted in FIG. 7A. The MTJ 700 in FIG. 7A includes a first magnetic layer 710 and a second magnetic layer 730, which are separated by an insulating layer 720. The first magnetic layer 710 and the second magnetic layer 730 may both independently be multilayer structures. FIG. 7B depicts a MTJ 700 in contact with a first electrode layer 740 and a second electrode layer 750. The first electrode layer 740 and the second electrode layer 750 electrically connect the first magnetic layer 710 and the second magnetic layer 730 respectively to a control circuit (not shown) providing read and write currents through the magnetic layers. The relative orientation of the magnetization vectors of the first magnetic layer 710 and the second magnetic layer 730 can be determined by the resistance across the MTJ 700; and the resistance across the MTJ 700 can be determined by the relative orientation of the magnetization vectors of the first magnetic layer 710 and the second magnetic layer 730.

The first magnetic layer 710 and the second magnetic layer 730 are generally made of ferromagnetic alloys such as iron (Fe), cobalt (Co), and nickel (Ni) alloys. In embodiments, the first magnetic layer 710 and the second magnetic layer 730 can be made of alloys such as FeMn, NiO, IrMn, PtPdMn, NiMn and TbCo. The insulating layer 720 is generally made of an insulating material such as aluminum oxide ($Al_2O_3$) or magnesium oxide (MgO).

The magnetization of one of the magnetic layers, for example the first magnetic layer 710 is generally pinned in a predetermined direction, while the magnetization direction of the other magnetic layer, for example the second magnetic layer 730 is free to rotate under the influence of a spin torque. Pinning of the first magnetic layer 710 may be achieved through, e.g., the use of exchange bias with an antiferromagnetically ordered material such as PtMn, IrMn and others.

A particular MTJ 700 can be read from by allowing a first current to flow through the memory cell in the direction of the second magnetic layer 730 (the free layer) to the first magnetic layer 710 (the pinned layer). The resistance of the MTJ 700 can change depending on whether the free layer is aligned with or aligned opposite to the pinned layer. A voltage, dependent on the resistance can then be detected and compared to a reference voltage determine whether the MTJ is aligned or opposite, i.e., contains a "1" or a "0". A particular MTJ 700 can be written to by allowing a second current (the second current is larger than the first current) to pass through the MTJ. Passing the current through one way will write a "1" and passing the current through the other way will write a "0".

Figure 7C:
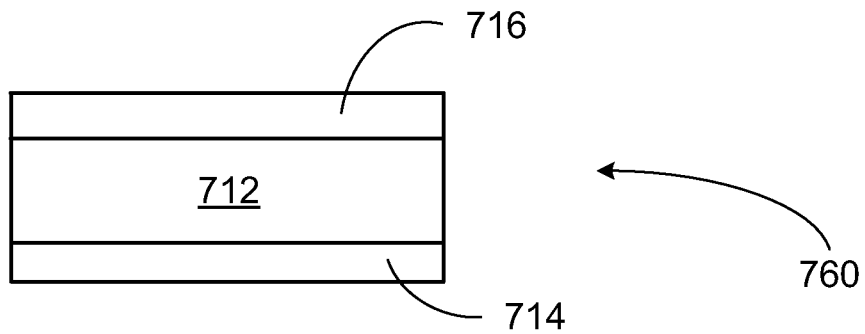

In embodiments, the RSM cell can be a RRAM cell. FIG. 7C is a schematic diagram of an illustrative resistive random access memory (RRAM) cell 760. The RRAM cell 760 includes a medium layer 712 that responds to an electrical current or voltage pulse by altering an electrical resistance of the medium layer 712. This phenomenon can be referred to as the electrical pulse induced resistance change effect. This effect changes the resistance (i.e., data state) of the memory from one or more high resistance state(s) to a low resistance state, for example. The medium layer 712 is interposed between a first electrode 714 and the second electrode 716 and acts as a data storage material layer of the RRAM cell. The first electrode 714 and the second electrode 716 are electrically connected to a voltage source (not shown). The first electrode 714 and a second electrode 716 can be formed of any useful electrically conducting material such as, for example, a metal.

The material forming the medium layer 712 can be any known useful RRAM material. In embodiments, the material forming the medium layer 712 can include an oxide material such as, a metal oxide. In some embodiments, the metal oxide is a binary oxide material or complex metal oxide material. In other embodiments, the material forming the medium layer 712 can include a chalcogenide solid electrolyte material or an organic/polymer material.

The binary metal oxide material can be expressed as a chemical formula of $M_xO_y$. In this formula, the characters "M", "O", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as the medium layer 712 include CuO, NiO, CoO, ZnO, $CrO_2$, $TiO_2$, $HfO_2$, $ZrO_2$, $Fe_2O_3$, and $Nb_2O_5$.

In embodiments, the metal oxide can be any useful complex metal oxide such as, for example, a complex oxide material having a formula $Pr_{0.7}Ca_{0.3}MnO_3$, or $SrTiO_3$, or $SiZrO_3$, or these oxides doped with Cr or Nb. The complex can also include $LaCuO_4$, or $Bi_2Sr_2CaCu_2O_8$. One example of a solid chalcogenide material is a germanium-selenide ($Ge_xSe_{100-x}$) containing a silver (Ag) component. One example of an organic material is Poly(3,4-ethylenedioxythiophene) (i.e., PEDOT).

The RSM cell can also include ferroelectric capacitors having structures similar to FIG. 7C using materials such as lead zirconate titanate (referred to as "PZT") or $SrBi_2Ta_2O_9$ (referred to as "SBT"). In such memory cells, an electrical current can be used to switch the polarization direction and the read current can detect whether the polarization is up or down. In such embodiments, a read operation is a destructive process, where the cell will lose the data contained therein, requiring a refresh to write data back to the cell.

Figure 8A:
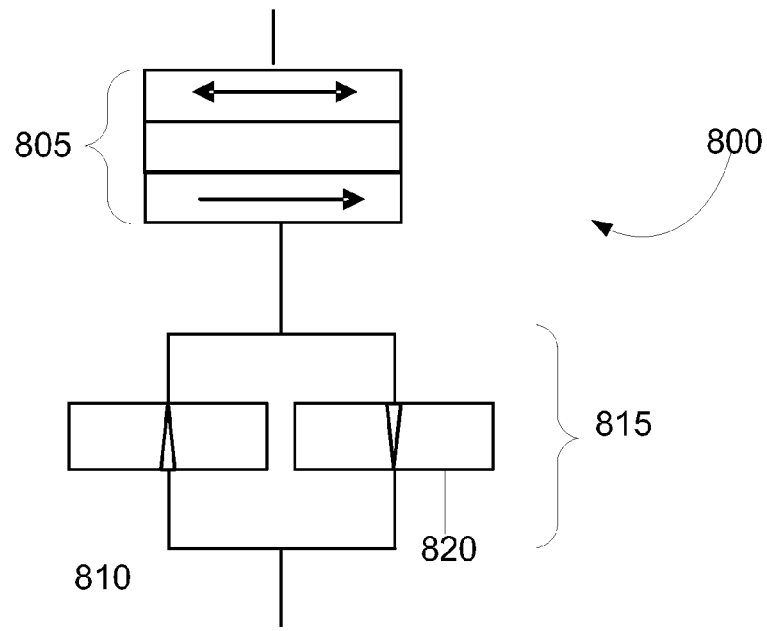
FIG. 8A is a schematic diagram of a non volatile memory element as disclosed herein.

Memory elements as disclosed include an electronic device as disclosed above, which can also be referred to as a switching device; and a non volatile memory cell. An exemplary embodiment of a memory element 800 as disclosed herein is depicted in FIG. 8A. The memory element 800 includes a switching device 815 that includes a first PMC 810 and a second PMC 820 electrically connected in anti-parallel; and a non volatile memory cell 805. The first PMC 810, as designated by the triangle, has an active electrode on top; and the second PMC 820, as designated by the inverted triangle, has an active electrode on the bottom. The switching device 815 is electrically connected, in series with the non volatile memory cell 805.

Figure 8B:
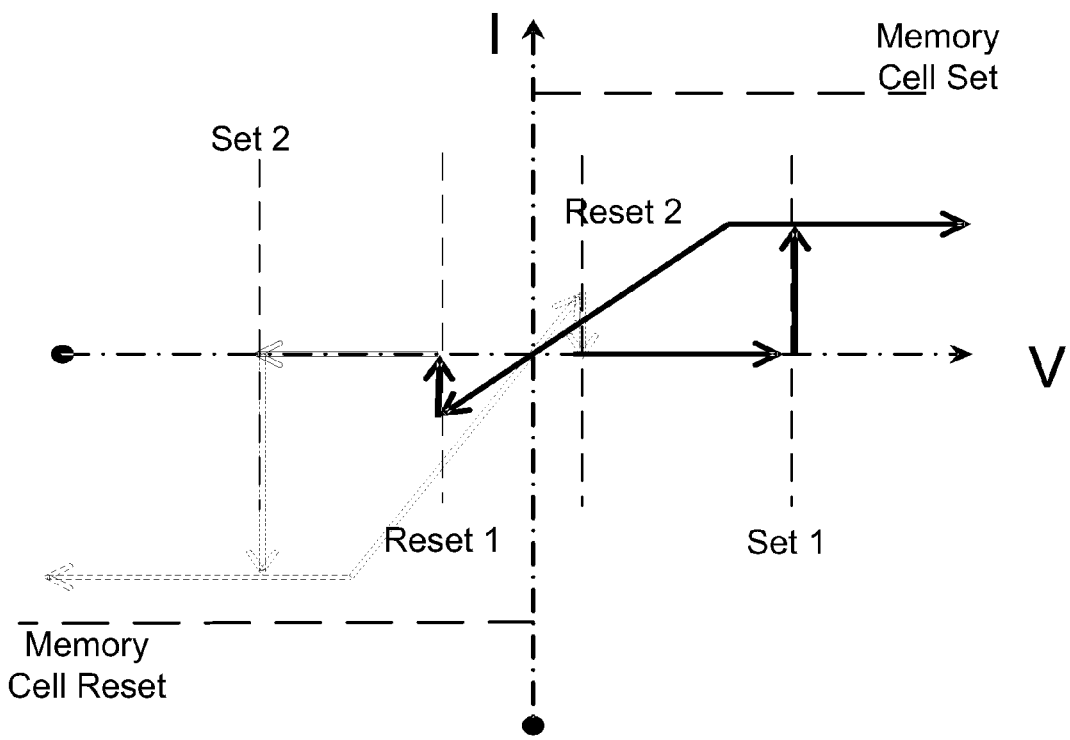
FIG. 8B is a representative current-voltage (I-V) curve of the non volatile memory element of FIG. 8A.

FIG. 8B depicts the I-V curve of the switching element 815 depicted in FIG. 8A. The characteristics of the I-V curve are the same as that seen in the I-V curve depicted in FIG. 4 and will not be discussed again. In order for the switching element 815 to function as a switch for the memory cell 805, either or both of the currents to set and/or reset the non volatile memory cell have to be greater than the currents to set and reset the switching element ($I_{Memory\ Cell-Set}$ and/or $I_{Memory\ Cell-Reset}$>$I_{Switch-Set}$>$I_{Switch-Reset}$). The I-V curve in FIG. 8B shows that both the currents necessary to set ("Memory Cell Set") and reset ("Memory Cell Reset") the non volatile memory cell 805 are greater than the currents necessary to set ("Set 1" and "Set 2") and reset ("Reset 1" and "Reset 2") the switching elements in either direction.

Methods of utilizing non volatile memory elements are also disclosed herein. A flowchart of an exemplary method is illustrated in FIG. 9A. The first step in this exemplary method, step 905, is to apply a first current ($I_1$). The first current can have a first amplitude and a first polarity. Application of the first current causes the switching device to be opened 907. The polarity of the first current will control the way in which the switching device opens. For example, for a switching element having a first PMC (left PMC) with an active electrode on the top (and therefore a second PMC (right PMC) with an active electrode on the bottom), application of a current (having sufficient amplitude) having a positive polarity will open the switching device so that current can flow from the top to the bottom of the switching device. The same switching element, upon application of a current (having sufficient amplitude) with a negative polarity will open the switching device so that current can flow from the bottom to the top of the device. Alternatively, a switching element having a first PMC with an active electrode on the bottom and a second PMC with an active electrode on the top, upon application of a positive polarity will open the switching device so that current can flow from the bottom to the top of the switching device. The same switching element, upon application of a current with a negative polarity will open the switching device so that current can flow from the top to the bottom of the device. The amplitude that is sufficient to open the switching device can be given by "Set 1" and "Set 2" in FIGS. 4 and 8B. The actual amplitude for any given switching device can be controlled at least in part by the materials of the PMC.

The next step in an exemplary method, step 909, is to apply a second current ($I_2$). The second current has a second amplitude and a second polarity. Application of the second current can cause an operation to be carried out on the memory cell 911. The operation that is carried out on the memory cell is dependent on the amplitude of the current. It should be noted that the polarity of the second current is generally the same as the polarity of the first current. This is shown in FIG. 9A, by the first and second current, $I_1$ and $I_2$, having a first polarity. This is the case because applying a second current having the opposite polarity of that which caused the switch to open would have the effect of closing the switch, and thereby not allowing the current to affect the memory cell.

The last step in an exemplary method is step 913, applying a third current ($I_3$). The third current has a third amplitude and a third polarity. Application of the third current causes the switch to close 915. Generally, a switching device can be closed by application of a current having the opposite polarity of the current that opened the switch. This is shown in FIG. 9A, by the first and second current, $I_1$ and $I_2$ having a first polarity and the third current, $I_3$ having a second polarity.

Application of the second current, which causes an operation to be carried out on the memory cell, step 909 can have three different effects on the memory cell. The memory cell can be read from or written to, or more specifically can be set (write "0"), or reset (write "1"). All three of these operations can be carried out by the method depicted in FIG. 9A. Specific methods of carrying out each of these three operations can be seen in FIGS. 9B, 9C and 9D.

Reading a memory cell can also be referred to as determining the resistance across a memory cell. FIG. 9B depicts specific exemplary steps that can be carried out in order to read a memory cell. The first step, step 921, is to apply a first current $I_1$. Generally, $I_1$ has a first amplitude and a first polarity. The first amplitude is such that it is high enough to open the switching device, 923. The first polarity can be either positive or negative, as it does not matter which way the current flows through the memory cell when determining the resistance of the memory cell, therefore the switching device can be "opened" and the current can flow through the memory cell in either direction. The next step, step 925, is to apply a second current, $I_2$. Generally, $I_2$ has a second amplitude and a first polarity. The polarity of $I_1$ and $I_2$ are the same, either they are both positive or they are both negative. The amplitude of $I_2$ is not so high that it changes the magnetization of the free layer in the memory cell, but is high enough to allow the resistance of the memory cell to be read. The switching device does not have to be considered with respect to the amplitude of $I_2$ because it is the same polarity current, therefore it will only keep the switch open. Determining the resistance 927 of the memory cell can be determined by detecting a voltage, which is dependent on the resistance and then comparing that detected voltage to a reference voltage to determine whether the MTJ (in the case of a STRAM cell) is aligned or opposite, i.e., contains a "1" or a "0". The next step, step 929 is to apply a third current, $I_3$. Generally, $I_3$ has a third amplitude and a second polarity. The polarity of $I_3$ is opposite to that of $I_1$ and $I_2$; so if $I_1$ and $I_2$ were positive then $I_3$ is negative; or if $I_1$ and $I_2$ were negative then $I_3$ is positive. The amplitude of $I_3$ is such that it is high enough to close the switching device but not so high that it modifies the magnetization of the free layer in the memory cell. Application of $I_3$ causes the switching element to close 931.

A more specific example of a method of reading the resistance across a memory cell can include the following. This method assumes that the switching device has the following characteristics: Set voltage ($V_{ms}$)=0.8 V, Reset Voltage ($V_{mr}$) =0.1 V, Minimum Resistance ($R_{min}$)=1 k; Maximum Resistance ($R_{max}$)=1 M; and the compliance current for set (I comp set)=100 μA; and the STRAM cell has the following characteristics: Minimum Resistance ($R_{min}$)=1 K; Maximum Resistance ($R_{max}$)=2K; and the current necessary to switch the STRAM=300 μA. In such a non volatile memory unit, the switch can be opened at a voltage of |1.0V| (+1.0 V will open the switch in one direction and −1.0 V will open the switch in the other direction). Once the switch is open, the memory state of the memory cell can be read by passing a current in the same direction as the switch opening current and determining the resistance. The current for reading must be less than about 300 μA; and in an embodiment can be about 50 μA. The voltage across the STRAM cell is then compared to a reference voltage to determine the resistance state of the STRAM cell. The switch is then closed by applying |0.4 V|, having the opposite polarity to that which opened the switch, with a maximum current of about 200 μA (so that the STRAM cell is not overwritten).

Setting a memory cell can also be referred to as erasing a memory cell, writing a "0" to a memory cell, or setting a memory cell to a high resistance state, which is generally effected by oppositely aligning the free layer and the pinned layer. FIG. 9C depicts specific exemplary steps that can be carried out in order to set a memory cell. The first step, step 933, is to apply a first current $I_1$. Generally, $I_1$ has a low amplitude and a positive polarity (+L). The amplitude (L) is such that it is high enough to open the switching device, and the positive polarity causes the specific switching element (i.e. a switching device having a first PMC with an active electrode on the top) to open so that current can flow from the top to the bottom of the switching device, 935. One of skill in the art will also understand, having read this specification that an oppositely configured device could have a negative polarity current (and corresponding changes in the upcoming steps) applied to it to accomplish the same effect. The next step, step 937, is to apply a second current, $I_2$. Generally, $I_2$ has a high amplitude and a positive polarity (−H). The amplitude of $I_2$ is high enough so that the magnetization direction of the free layer is flipped to be anti-parallel to the pinned layer. The switching device does not have to be considered with respect to the amplitude of $I_2$ because it is the same polarity current, therefore it will only keep the switch open. Once the free layer is anti-parallel to the pinned layer, the memory cell is considered to be set 939, or written to "0". The next step, step 941 is to apply a third current, $I_3$. Generally, $I_3$ has a low amplitude and a negative polarity (−L). The amplitude of $I_3$ is such that it is high enough to close the switching device but not so high that it modifies the magnetization of the free layer in the memory cell. Application of $I_3$ causes the switching element to close 943.

A more specific example of a method of setting a memory cell can include the following. This method assumes that the switching device has the following characteristics: Set voltage ($V_{ms}$)=0.8 V, Reset Voltage ($V_{mr}$)=0.1 V, Minimum Resistance ($R_{min}$)=1 k; Maximum Resistance ($R_{max}$)=1 M; and the compliance current for set (I comp set)=100 μA; and the STRAM cell has the following characteristics: Minimum Resistance ($R_{min}$)=1 K; Maximum Resistance ($R_{max}$)=2K; and the current necessary to switch the STRAM=300 μA. In such a non volatile memory unit, the switch can be opened at a voltage of 1.0V. Once the switch is open, the memory cell can be set by passing a current (in the same direction as the switch opening current) of about 300 µA. The switch can then be closed by applying a voltage of −0.4V.

The memory cell can also be reset. Resetting a memory cell can also be referred to as writing a "1" to a memory cell, or setting the resistance state of a memory cell to a low resistance state, which is generally effected by parallely aligning the free layer and the pinned layer. FIG. 9D depicts specific exemplary steps that can be carried out in order to reset a memory cell. The first step, step 951, is to apply a first current $I_1$. Generally, $I_1$ has a low amplitude and a negative polarity (−L). The amplitude (L) is such that it is high enough to open the switching device, and the negative polarity causes the specific switching element (i.e. a switching device having a first PMC with an active electrode on the top) to open so that current can flow from the bottom to the top of the switching device, 953. One of skill in the art will also understand, having read this specification that an oppositely configured device could have a positive polarity current (and corresponding changes in the upcoming steps) applied to it to accomplish the same effect. The next step, step 955 is to apply a second current, $I_2$. Generally, $I_2$ has a high amplitude and a negative polarity (−H). The amplitude of $I_2$ is high enough so that the magnetization direction of the free layer is flipped to be parallely aligned with the pinned layer. The switching device does not have to be considered with respect to the amplitude of $I_2$ because it is the same polarity current, therefore it will only keep the switch open. Once the free layer is parallel to the pinned layer, the memory cell is considered to be reset 957, or written to "1". The next step, step 959 is to apply a third current, $I_3$. Generally, $I_3$ has a low amplitude and a positive polarity (+L). The amplitude of $I_3$ is such that it is high enough to close the switching device but not so high that it modifies the magnetization of the free layer in the memory cell. Application of $I_3$ causes the switching element to close 961.

A more specific example of a method of resetting a memory cell can include the following. This method assumes that the switching device has the following characteristics: Set voltage ($V_{ms}$)=0.8 V, Reset Voltage ($V_{mr}$)=0.1 V, Minimum Resistance ($R_{min}$)=1 k; Maximum Resistance ($R_{max}$)=1 M; and the compliance current for set (I comp set)=100 µA; and the STRAM cell has the following characteristics: Minimum Resistance ($R_{min}$)=1 K; Maximum Resistance ($R_{max}$)=2K; and the current necessary to switch the STRAM=300 µA. In such a non volatile memory unit, the switch can be opened at a voltage of −1.0V. Once the switch is open, the memory cell can be reset by passing a current (in the same direction as the switch opening current) of about −300 µA. The switch can then be closed by applying a voltage of 0.4V.

Memory elements as disclosed herein can be utilized in memory arrays. In embodiments, memory elements as disclosed herein can be utilized in crossbar memory arrays. An exemplary depiction of a crossbar memory array is illustrated in FIG. 10A. An exemplary crossbar memory array includes a first layer of approximately parallel conductors 1002 that are overlain (or underlain) by a second layer of approximately parallel conductors 1004. In embodiments, the conductors of the second layer 1004 can be substantially perpendicular, in orientation, to the conductors of the first layer 1002. In embodiments, the orientation angle between the layers may be other than perpendicular. The two layers of conductors form a lattice, or crossbar, each conductor of the second layer 1004 overlying all of the conductors of the first layer 1002 and coming into close contact with each conductor of the first layer 1002 at conductor intersections that represent the closest contact between two conductors. Although individual conductors in FIG. 10A are shown with rectangular cross sections, conductors can also have square, circular, elliptical, or any other regular or irregular cross sections. The conductors may also have many different widths or diameters and aspect ratios or eccentricities.

Memory elements as disclosed above can be disposed at least some of the conductor intersections of the crossbar memory arrays. In embodiments, disclosed memory elements can be disposed at substantially all of the conductor intersections. A conductor intersection connected by disclosed memory elements can be referred to as a "crossbar junction." FIGS. 10B and 10C provide two different illustrations of a crossbar junction that interconnects conductors 1002a and 1004a of two contiguous layers within a crossbar memory array. The crossbar junction may or may not involve physical contact between the two conductors 1002a and 1004a. As shown in FIG. 10B, the two conductors are not in physical contact at their overlap point, but the gap between the conductors 1002a and 1004a is spanned by the memory element 1006a that lies between the two conductors at their closest overlap point. FIG. 10C illustrates a schematic representation of the memory element 1006a and overlapping conductors 1002a and 1004a shown in FIG. 10B.

Disclosed memory elements may be advantageously utilized in crossbar memory arrays because the switching devices that are included in the memory elements can function as an integrated selective element that can avoid or minimize disturbances on unintended cells during read, write and erase operations due to sneak currents. The switching devices disclosed herein are especially advantageous in combination with STRAM because STRAM requires writing and erasing operations to be carried out using opposite polarities.

EXAMPLES

Simulation of Switching Device

Simulations were carried out to model a switching element such as that depicted in FIG. 3. The parameters were set as follows: Vms: Set Voltage of PMC (the voltage amplitude required to have switch to be low R)=0.8 V; Vmr: Reset Voltage of PMC (the voltage amplitude required to have switch to be high R)=0.1 V; Rmin: Minimal resistance=1 k; Rmax: Maximal resistance=1 M; and I comp set: compliance current for set=100 µA.

Figure 11A:
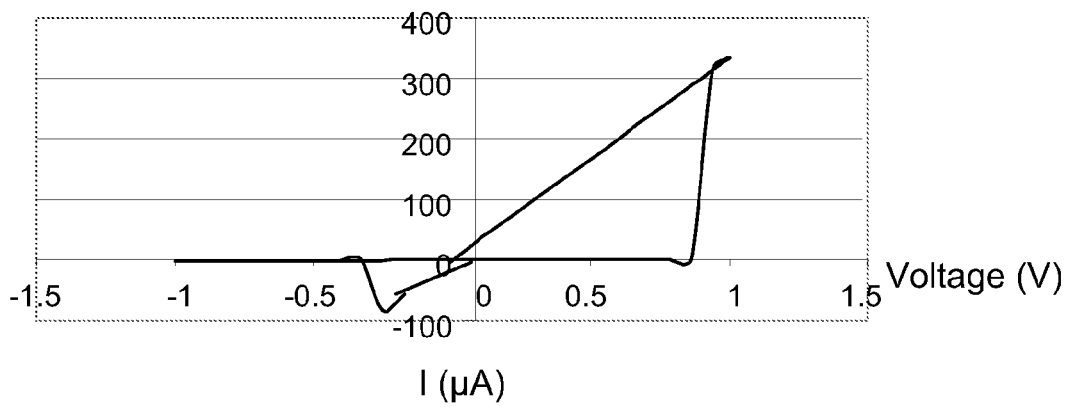
FIG. 11A through 11C show I-V curves from a simulation of a switching device showing the first PMC (FIG. 11A); the second PMC (FIG. 11B); and the entire switching device (FIG. 11C)
Figure 11B:
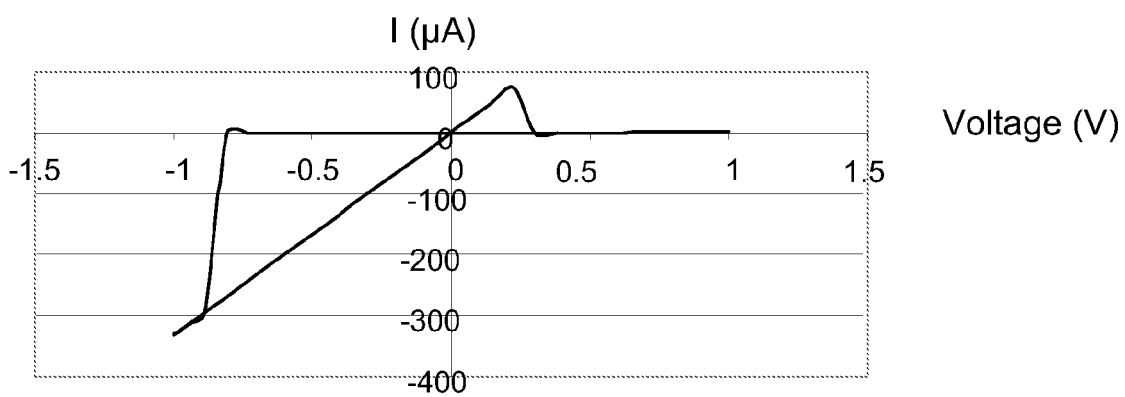
Figure 11C:
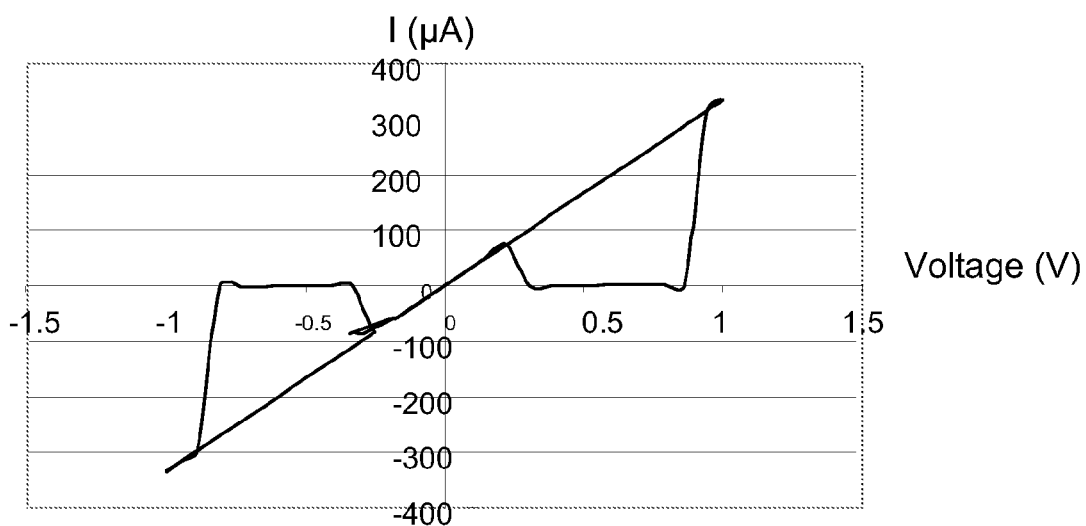

The I-V curves from the simulation are shown for the first PMC (left PMC) in FIG. 11A; the second PMC (right PMC) in FIG. 11B; and the entire switching device in FIG. 11C.

Simulation of Non Volatile Memory Unit

Simulations were carried out to model a switching element such as that depicted in FIG. 3. The parameters of the switching element were set as follows: Vms: Set Voltage of PMC (the voltage amplitude required to have switch to be low R)=0.8 V; Vmr: Reset Voltage of PMC (the voltage amplitude required to have switch to be high R)=0.1 V; Rmin: Minimal resistance=1 k; Rmax: Maximal resistance=1 M; and I comp set: compliance current for set=100 µA. The parameters for the STRAM cell were set as follows: Rmin: Minimal resistance=1 K; Rmax: Maximal resistance=2 K; and I STRAM set: compliance current for switching the STRAM cell=300 µA.

Figure 12A:
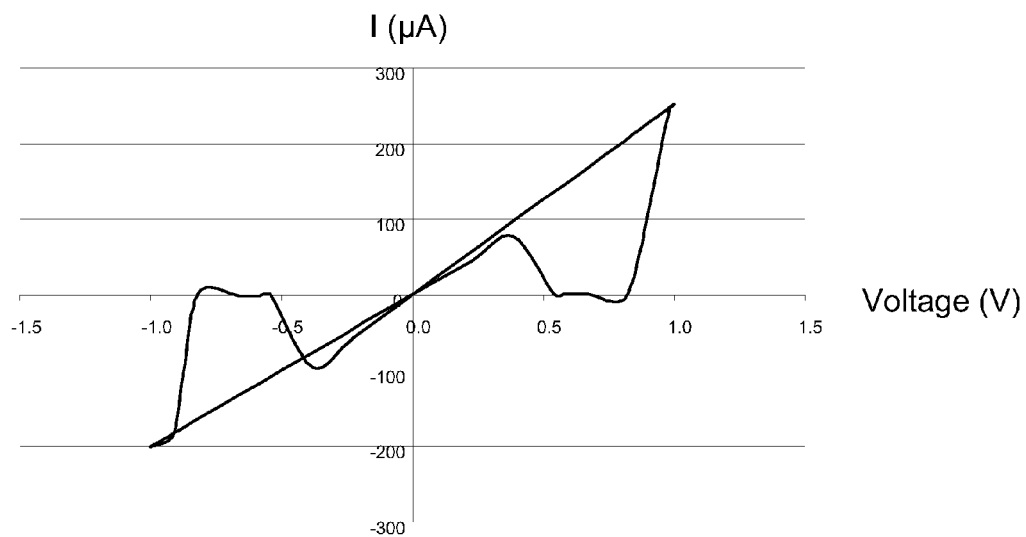
FIGS. 12A and 12B show an I-V curve for a simulation of a non volatile memory unit (FIG. 12A) and the resistance of the STRAM and voltage of the non volatile memory unit as a function of current (FIG. 12B).
Figure 12B:
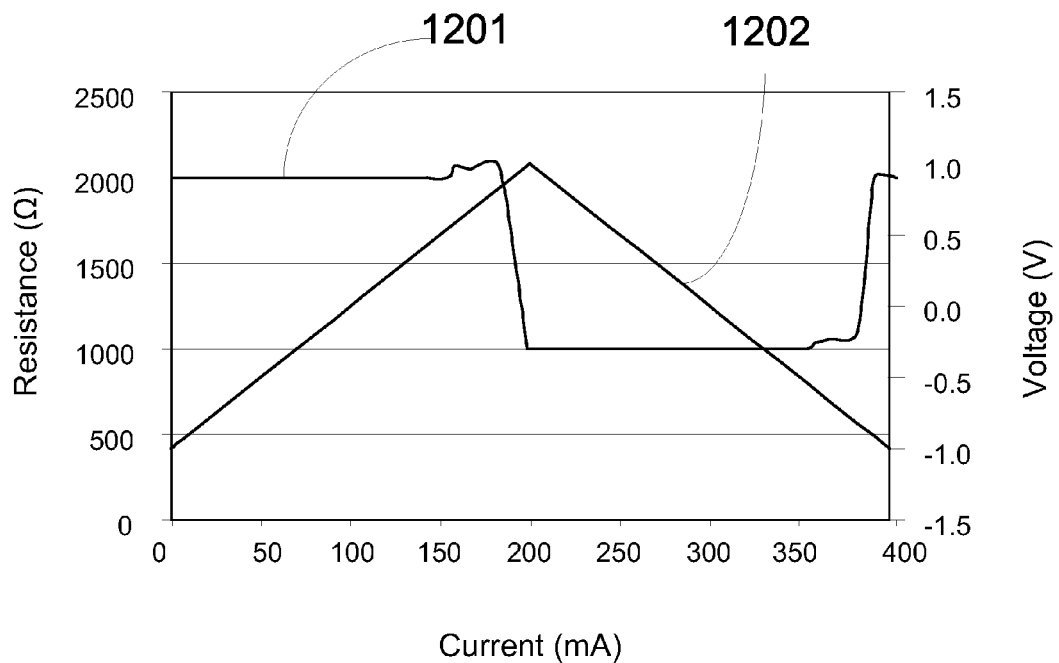

The I-V curve from the simulation is shown in FIG. 12A. FIG. 12B shows the STRAM resistance (ohms) curve 1201 and the voltage (Volts) of the non volatile memory unit curve 1202 as a function of the current (µA).

Thus, embodiments of PROGRAMMABLE METALLIZATION CELL SWITCH AND MEMORY UNITS CONTAINING THE SAME are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. An electronic device comprising:
a first programmable metallization cell (PMC) that comprises
an active electrode;
an inert electrode; and
a solid electrolyte layer disposed between the active electrode and the inert electrode; and
a second PMC that comprises
an active electrode;
an inert electrode; and
a solid electrolyte layer disposed between the active electrode and the inert electrode,
wherein the first and second programmable metallization cells are electrically connected in anti-parallel.

2. The electronic device according to claim 1, wherein the active electrodes of the first and second programmable metallization cells comprise independent metal layers.

3. The electronic device according to claim 2, wherein the active electrode of the first programmable metallization cell comprises a first metal layer and a top electrode of the device and the active electrode of the second programmable metallization cell comprises a second metal layer and a bottom electrode of the device.

4. The electronic device according to claim 1, wherein
the active electrodes of the first and second PMCs independently comprise silver (Ag), copper (Cu), tantalum (Ta), titanium (Ti), tungsten (W) gold (Au), platinum (Pt), palladium (Pd), rhodium (Rh), or combinations thereof;
the inert electrodes of the first and second PMCs independently comprise tungsten (W), molybdenum (Mo), platinum (Pt), iridium (Ir), titanium (Ti), metal silicides, metal nitrides, or combinations thereof; and
the solid electrolyte layers of the first and second PMCs independently comprise germanium-selenide ($Ge_xSe_{1-x}$) materials, $Ge_2Sb_2Te_5$ (GST) materials, $WO_3$, $SiO_2$, poly(3,4-ethylenedioxythiophene) (PEDOT), or combinations thereof.

5. The electronic device according to claim 1 further comprising an over potential layer in contact with one or both of the inert electrodes of the first and second programmable metallization cells.

6. The electronic device according to claim 1, wherein the first and second programmable metallization cells share a bottom electrode and a top electrode of the device and an insulating region separates the first and second programmable metallization cells.

7. A non volatile memory element comprising:
a switching device comprising:
a first programmable metallization cell (PMC) that comprises
an active electrode;
an inert electrode; and
a solid electrolyte layer disposed between the active electrode and the inert electrode; and
a second PMC that comprises
an active electrode;
an inert electrode; and
a solid electrolyte layer disposed between the active electrode and the inert electrode
wherein the first and second PMCs are electrically connected in anti-parallel; and
a non volatile memory cell,
wherein the switching device is electrically connected in series with the non volatile memory cell.

8. The non volatile memory element according to claim 7, wherein the active electrodes of the first and second programmable metallization cells comprise independent metal layers.

9. The non volatile memory element according to claim 7 further comprising an over potential layer in contact with one or both of the inert electrodes of the first and second programmable metallization cells.

10. The non volatile memory element according to claim 7, wherein the first and second programmable metallization cells share a bottom electrode and a top electrode of the device.

11. The non volatile memory element according to claim 10, wherein the solid electrolyte layers and metal layers of the first and second programmable metallization cells are separated by an insulating material.

12. The non volatile memory element according to claim 7 wherein the non volatile memory cell is a spin torque transfer random access memory (STRAM) stack.

13. The non volatile memory element according to claim 7, wherein the non volatile memory cell is included in a crossbar memory array.

14. A method of utilizing a non volatile memory element comprising the steps of:
providing a non volatile memory element, the non volatile memory element comprising:
a switching element comprising a first and second programmable metallization cell (PMC) configured in anti-parallel; and
a non volatile memory cell having at least a high resistance state and a low resistance state,
wherein the switching element is electrically connected in series with the non volatile memory cell;
applying a first current to the non volatile memory element, the first current having a first polarity and a first amplitude, wherein application of the first current opens the switching element;
applying a second current to the non volatile memory element, the second current having a second polarity and a second amplitude, wherein application of the second current reads from or writes to the non volatile memory cell; and
applying a third current to the non volatile memory element, the third current having a third polarity and a third amplitude, wherein application of the third current closes the switching element,
wherein the first current and the second current have the same polarity and the third current has a polarity that is opposite from the first current and the second current.

15. The method according to claim 14, wherein the third amplitude is less than the first amplitude.

16. The method according to claim 14, wherein the second current writes to the non volatile memory cell by affecting the resistance state of the non volatile memory cell.

17. The method according to claim 16, wherein the second current has a larger amplitude than both the first current and the third current.

18. The method according to claim 14, wherein the second current reads from the non volatile memory cell by determining the resistance of the non volatile memory cell.

19. The method according to claim 14, wherein the non volatile memory cell is a STRAM cell.

* * * * *